United States Patent [19]

Weedon et al.

[11] Patent Number: 5,420,537
[45] Date of Patent: May 30, 1995

[54] HIGH POWER SOLID STATE R.F. AMPLIFIER

[75] Inventors: Hans Weedon, Salem; Louis R. Poulo, Andover; Ravindran Sundar, Wilmington; Mark R. Jones, Wakefield; Ching T. Lee, Chelmsford, all of Mass.

[73] Assignee: Analogic Corporation, Peabody, Mass.

[21] Appl. No.: 129,585

[22] Filed: Sep. 30, 1993

Related U.S. Application Data

[63] Continuation-in-part of Ser. No. 945,276, Sep. 15, 1992, abandoned.

[30] Foreign Application Priority Data

Sep. 15, 1994 [WO] WIPO .................. PCT/US93/08726

[51] Int. Cl.⁶ ............................................. H03F 3/193
[52] U.S. Cl. .................................... 330/251; 330/269; 330/276; 330/277; 330/295
[58] Field of Search .................... 330/207 A, 251, 269, 330/276, 277, 295

[56] References Cited

U.S. PATENT DOCUMENTS 4,733,194  3/1988  Ruehrs et al. ..................... 330/251
5,049,836  9/1991  Christie et al. .................... 330/277
5,187,580  2/1993  Porter, Jr. et al. ............. 330/251 X

OTHER PUBLICATIONS

Ikeda, "Development of a Solid State Radio Transmitter with MOS/FET", *IEEE Transactions on Broadcasting*, vol. BC-26, No. 4, Dec. 1980, pp. 99-112.

*Primary Examiner*—James B. Mullins
*Attorney, Agent, or Firm*—Lappin & Kusmer

[57] ABSTRACT

Although known because of high packaging inductances and thought to be wholly unsuitable for RF amplifiers, high voltage power switching MOSFETs of the type having coplanar leads having inductances on the order of between 8 nH and 15 nH are used in an RF amplifier. The individual devices operate on a high impedance load line to render the high inductance insignificant. The circuit configuration presents a high impedance to the output, eliminating the need for expensive combiners and low inductance packaging.

17 Claims, 5 Drawing Sheets

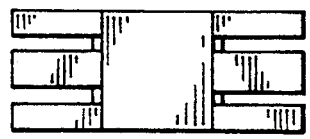
FIG. 1
(PRIOR ART)
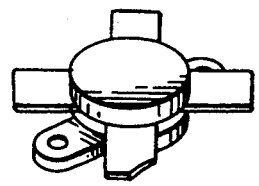
FIG. 3
(PRIOR ART)
FIG. 2
(PRIOR ART)
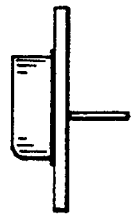 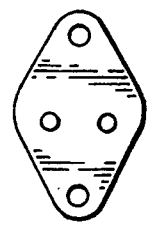
FIG. 4          FIG. 5
(PRIOR ART)   (PRIOR ART)
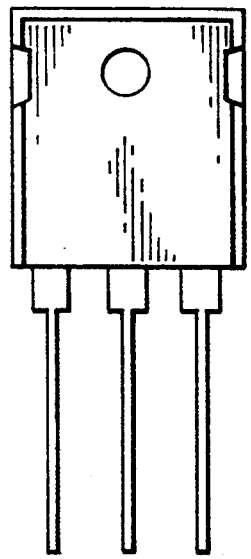
FIG. 6
(PRIOR ART)
FIG. 7
(PRIOR ART)

HIGH POWER SOLID STATE R.F. AMPLIFIER

RELATED APPLICATION

This application is a continuation-in-part application of prior U.S. Application Ser. No. 07/945,276 filed Sept. 15, 1992 and now abandoned.

FIELD OF THE INVENTION

This invention relates generally to high power, solid state, radio frequency (RF) amplifiers, and more particularly to RF amplifiers that produce at least 500 watts of output power at frequencies of at least 100 KHz and as high as 100 MHz and higher.

BACKGROUND OF THE INVENTION

Due to their well known lower production cost, longer life and greater reliability, solid state amplifier circuits have replaced vacuum tube circuits in almost every application. In the area of RF amplifiers with high power output, however, vacuum tube circuits still have such a large cost advantage that they are preferred in most situations. Only where there is a great premium on long-term maintenance is it considered economical to use solid state devices. There are two major reasons for this.

First, suitable semiconductor devices for this application are expensive. A number of companies market families of RF metal oxide, field effect transistors (MOSFETs) designed for this service and known as RF power MOSFETs. Examples of such devices are the Motorola MRF series (such as the Motorola MRF 150), the SGS Thompson SD series and the Philips BLF series. The Direct Energy DE series (such as the DE 275) use high voltage switching MOSFET devices in expensive RF packages. Each of these currently sells, in quantity, at about fifty dollars or more for a 150 watt device. The high cost is due, at least in part, to the fact that to deliver high power at RF, special packaging is required. See, for example, U.S. Pat. No. 4,891,686.

As shown in FIGS. 1–3 each of the specially packaged RF power MOSFETs has flat or ribbon-like leads providing lead inductances between about 1 nH and 4 nH. FIGS. 1 and 2, for example show the packaged DE-275, while FIG. 3 shows the Motorola MRF150.

Second, for high power outputs, i.e., outputs greater than 500 watts, the output of several devices must be combined. Straight parallel combining, however, reduces the output impedance of the combination still further. In fact, it divides the impedance of a single device by the number of devices in parallel. A typical RF MOSFET (such as Motorola MRF150) has a optimum load impedance of approximately 3–4 ohms. Thus, if each device is operating into 3.2 ohms, two devices in parallel operate into 1.6 ohms. The impedance of a 50 ohm load, therefore, must be transformed to match the combination of devices. This requires the impedance transforming capability of hybrid combiners. Because of the high currents needed to generate high power at these low impedances, the needed combiners are also very expensive. Further, because hybrid combiners typically combine only two paths into one, to combine the power output of eight MOSFETs, for example, seven combiners are required. The added expenses, therefore, of very low inductance device packaging and many high current combiners make the current solid state, high power, RF amplifier non competitive in many applications.

This invention is based on the utilization of non-RF switching MOSFETs, on the market for over four years, but prior to the present invention thought to be unsuitable for RF amplifiers because of their high lead inductance. According to the present invention, they are used in a way that eliminates the need for expensive packaging and combiners. There has been at least one suggestion that an amplifier can be constructed with non-RF MOSFETs. In Ikeda, "Development of a Solid State Radio Transmitter with MOS/FET", published in the IEEE Transactions on Broadcasting, Vol. BC-26, No. 4, (December 1980), pp 99–112, it has been suggested that the JEDEC TO-3 packaged MOSFET can be used in an RF power amplifier for use in transmitting in the AM bandwidth (generally between about 0.5 and 1.5 MHz. Ikeda has described RF amplifiers operating as high as 9.535 MHz, where efficiency drops to 70%. It is clear that greater frequencies can not be efficiently achieved, particularly at 65 MHz and higher where certain applications (such as magnetic resonance imaging) require operation of an amplifier at such RF frequencies. Further, the TO-3 packaged device provides relatively high lead inductances of between about 12 nH and 25 nH, and is not configured for modern production techniques where the leads are made coplanar to one another. As shown in FIGS. 4 and 5, the device is enclosed within a metal casing with two wire leads extending from the bottom of the device.

At the same time that amplifier oriented semi-conductor designers have been creating the RF power MOSFET by lowering the inductances of such devices, switching oriented designers have been improving the power switching MOSFET for better switching performance by increasing its breakdown voltage and switching speed. The result is a class of switching devices that have ordinary, inexpensive packaging, but have high breakdown voltage and enough speed to operate efficiently high into the RF range. This class may properly be called high voltage, power switching MOSFETs, as opposed to and distinguishable from RF power MOSFETs. Examples of such devices include non-RF devices, such as the APT 5085 packaged as the TO-247. Other devices are available and packaged as the TO-220. A non-RF MOSFET device packaged in accordance with the JEDEC TO-247 format is shown in FIGS. 6 and 7. In general the package is provided with a MOSFET encased with leads co-planar and extending from one side of the casing. As in the case of the TO-3 device the lead inductances of these non-RF devices are significantly higher than the 1–4 nH of the special RF packages.

OBJECTS OF THE INVENTION

We have discovered that, contrary to conventional wisdom, when done properly in accordance with our invention, members of this inexpensive class of devices, called non-RF high voltage, power switching MOSFETs of the type TO-220 and T-247, can be incorporated into an RF power amplifier that has no need for expensive low impedance packaging and expensive combiners and yet is capable of efficiently operating within a frequency range as low as 100 KHz and as high as 100 MHz and higher. The result is a reliable, but much less expensive power amplifier that competes, on a cost basis, favorably with vacuum tube amplifiers.

It is therefore objects of the present invention to provide an improved RF power amplifier (1) using non-RF packaged, high voltage, power switching MOSFETs of the TO-220 or TO-247 type having coplanar leads for ease of connection and lead inductances between about 8 nH and 15 nH, (2) that does not require expensive low inductance packaging, (3) that can be connected to relatively large impedance loads without the need for expensive combiners and (4) capable of efficiently operating at frequencies between 100 KHz and 100 MHz and higher.

Other objects of the present invention will in part be obvious and will in part appear hereinafter. The invention accordingly comprises the apparatus possessing the construction, combination of elements, and arrangement of parts exemplified in the following detailed disclosure, and the scope of the application of which will be indicated in the claims.

SUMMARY OF THE INVENTION

In its most basic form the high power, radio frequency amplifier comprises at least one high voltage, power switching, MOSFET device of the type having leads coplanar with one another and inductances on the order of between 8 nH and 15 nH, and having a gate, source and drain electrode; driving means for connecting said input signal between the gate and source of said device; and coupling and matching means, connected to the drain electrode of said device, for providing said output signal. A plurality of the high voltage, power switching, MOSFET devices of the type described can be provided in parallel so as to form a single ended amplifier, or two sets or pluralities of high voltage, power switching, MOSFET devices can be provided, each in parallel. In the latter configuration the driving means connects the input signal between the gates and sources of the first plurality and the inverse of the input signal between the gates and sources of the second plurality to drive the respective pluralities in phase opposition. The coupling and matching means connects the signals from the drain electrodes of one of the pluralities with the inverse of the signals from the drain electrodes of the other of the pluralities to produce the output signal. The high voltage power switching MOSFETs of the type described can operate on a high impedance load line greater than 15 ohms, making their high output inductances insignificant. The circuit configuration presents the high load line impedance to the output, eliminating the need for expensive low impedance packaging or parallel combiners.

BRIEF DESCRIPTION OF THE DRAWING

For a fuller understanding of the nature and objects of the present invention, reference should be had to the following detailed description taken in connection with the accompanying drawing wherein:

FIG. 1 and 2 show a top and side view, respectively, of an expensively RF packaged MOSFET of the DE-275 type;

FIG. 3 shows a perspective view of another expensively RF packaged MOSFET of the Motorola MRF 150 type;

FIGS. 4 and 5 show the TO-3 packaged, non-RF MOSFET device utilized in the prior art device described, for example, by Ikeda;

FIGS. 6 and 7 show, respectively, a top and side view of the non-RF MOSFET device utilized in the present invention;

DETAILED DESCRIPTION OF THE DRAWING

Figure 8:
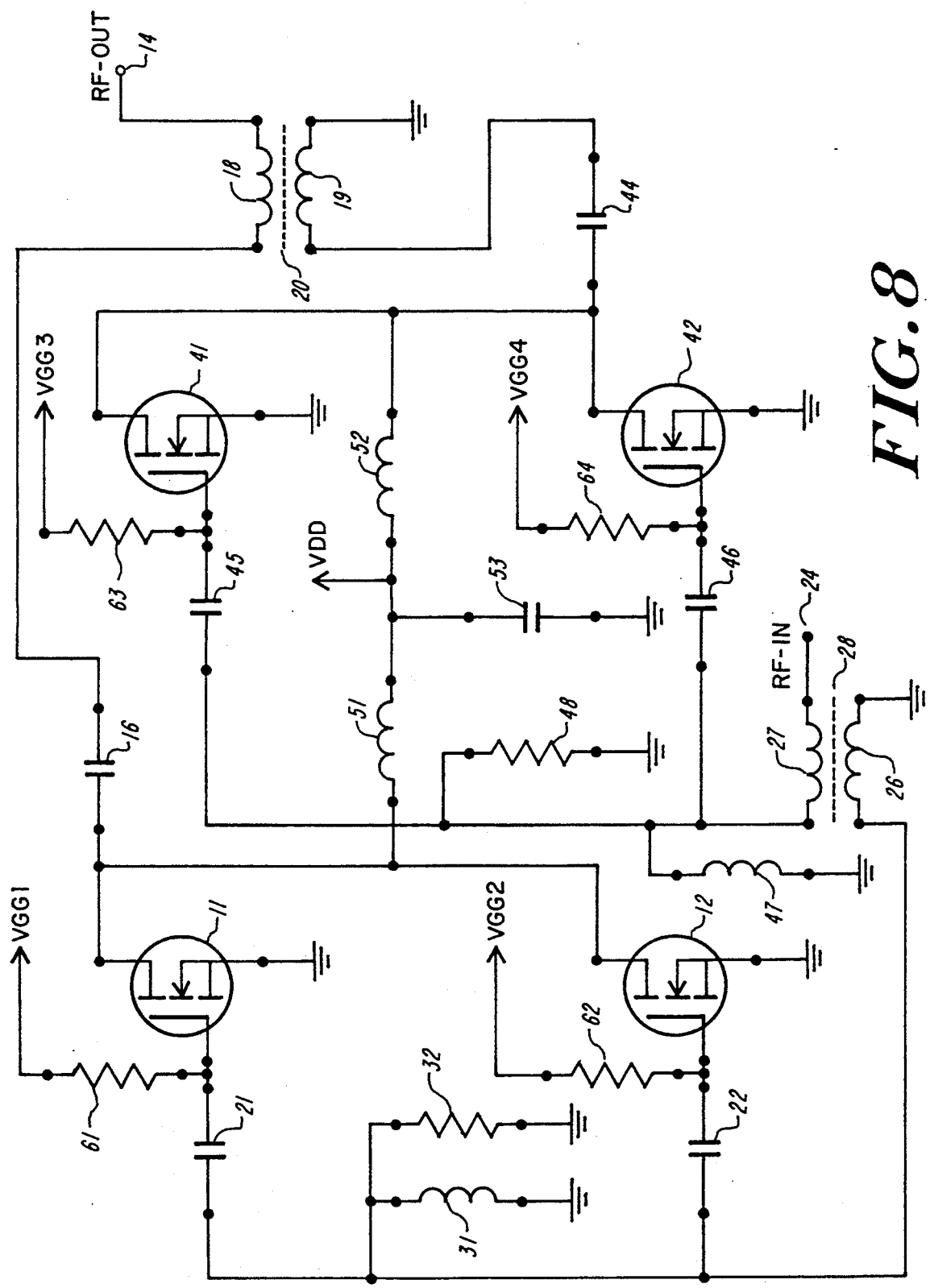
FIG. 8 shows a schematic diagram of the preferred embodiment of the RF amplifier circuit using two sets of pluralities of high voltage, power switching, MOSFET devices of the type shown in FIGS. 6 and 7 connected so that the two sets are driven in phase opposition.

Referring to the drawings, FIG. 8 illustrates a schematic diagram of the preferred embodiment of the RF amplifier circuit of the present invention using two sets of pluralities of high voltage, power switching, MOSFET devices of the type shown in FIGS. 6 and 7, connected so that the two sets are driven in phase opposition. In this circuit the respective drain electrodes of a first pair of high voltage, power switching, MOSFETs 11 and 12 are connected directly together into the high side of an amplifier output port 14 via a coupling capacitor 16 and a first winding 18 of an output balun transformer 20. The source electrodes of transistors 11 and 12 ate connected directly to system ground. The gate electrodes are connected together through respective DC blocking capacitors 21 and 22, and thence in common to the ground side of an input port 24 through a first winding 26 of an input balun transformer 28. An inductor 31 and a resistor 32 are connected in parallel between the high side of winding 26 and system ground.

The respective drain electrodes of a second pair of high voltage power switching MOSFETs 41 and 42 are directly connected together and to the grounded side of amplifier output port 14 via a coupling capacitor 44 and winding 19 of output balun transformer 20. The source electrodes of transistors 41 and 42 may also be connected directly to system ground. The gate electrodes of these two transistors may be connected together through respective blocking capacitors 45 and 46 and thence in common through winding 27 of input balun transformer 28 to the high side of RF input port 24. An inductor 47 and a resistor 48 may be connected in parallel between the junction of winding 27, capacitor 45 and capacitor 46, and system ground. Operating voltage may be supplied from a supply source $V_{DD}$ to the drain electrodes of MOSFETs 11 and 12 through a first choke 51 and to the drain electrode of MOSFETs 41 and 42 through a second choke 52. A capacitor 53 may shunt source $V_{DD}$ to system ground. Finally, transistors 11, 12, 41 and 42 may be biased from individual respective sources $V_{GG1}$, $V_{GG2}$, $V_{GG3}$ and $V_{GG4}$ via respective resistors 61, 62, 63 and 64.

Fundamental to obtaining the cost advantage of the invention is the use of high voltage power switching MOSFETs for devices 11, 12, 41 and 42 which as previously described are of the type shown in FIGS. 6 and 7. There are several lines available including, for example, the mega-MOSFET series of International Rectifier Corp., The HDMOS series of IXYS Corp. and the power MOS IV series of APT Corp. These devices are currently priced in the neighborhood of $5.00 for a 150 watt device, about one-tenth the price of RF power MOSFETs of comparable power rating. The high voltage power switching MOSFET class may be defined as having lead inductances in the order of between about 8 nH and 15 nH.

The 5085 BN, produced by APT may be considered a typical example and has the following ratings:

$V_{ds\ max.} = 500$ v.
$C_{iss} = 700$ pf.
$C_{oss} = 90$ pf.
$C_{rss} = 60$ pf.
$R_{j-c} = 0.68°$ C./w
$P_{diss.max.} = 150$ w.

With this high voltage power switching MOSFET, allowing a 10% safety margin, peak drain-source voltage may be 450 v., or 159 v. RMS from a $v_{DD}$ of 225 v. To develop 500 watts at 159 volts requires a load of 50.6 ohms. Each device can therefore operate into a load line of about 50 ohms. This requires only a little over 3 amps RMS output current per device. Further, at this output impedance level, the 2 or 3 ohms impedance due to lead inductance at, for example, 20 MHz. is insignificant.

It can readily be seen from the representative circuit of the drawing that at the RF signal frequency, MOSFET 11 is connected directly in parallel with MOSFET 12, and MOSFET 41 is connected directly in parallel with MOSFET 42. In order for each MOSFET device to operate on a 50 ohm load line, therefore, the impedance driving each pair must be 25 ohms. The RF signal applied to input port 24 drives both pairs of MOSFETs. Because of the winding directions of windings 26 and 27 of input balun transformer 28, however, the transistor pairs are driven in exact opposite phase. That is, when the drain currents in transistors 11 and 12 are increasing, those in transistors 41 and 42 are decreasing. Since the relative winding directions of output balun transformer 20 are similar, however, the out-of-phase drain currents add in-phase to produce the combined RF output signal. These simple transformer connections have the effect of adding the impedances seen by each winding. With each device pair driving and, in turn being driven by 25 ohms, therefore, the circuit input and output impedances each become 50 ohms. The advantageous result of this connection is that the 50 ohm load and 50 ohm driving circuit can be well matched without the need of expensive hybrid combiners or expensive low impedance packaging. A simple 1:1 balun transformer can be used for transformers 20 and 28.

It should be pointed out that the circuit of the drawing has been simplified for the purpose of clarity. Those skilled in the art of radio frequency amplifier design will recognize, for example, that no detail has been shown of the biasing arrangement for each MOSFET device, other than to indicate independent biasing sources for ease in balancing the load on each device. Suitable arrangements are well known, and may be as described for example, in the article, "Get 600 Watts RF From Four Power FETs", by Helge Granberg, Motorola RF Device Data Bulletin EB 104. Also, those skilled in the art will recognize that good RF construction techniques to minimize additional stray inductance and capacitance are still required.

Inductance 31 and inductance 47 are chosen to tune the input of the circuit. Similarly, chokes 51 and 52 and capacitance 53 are chosen to tune the output circuit. Resistances 32 and 48 are used to lower the Q of the input circuit, if required.

Other driving arrangements can be substituted for that shown in the drawing and ordinary push-pull arrangement, for example, a circuit in which the input transformer is center tapped, may be used. The important thing is that the transistor pairs are driven opposite in phase. Similarly, other output arrangements including push-pull transformers or hybrid combiners may be used to combine the output signals of the transistor pairs in 180 degree relationship.

This novel combination of high voltage power switching MOSFETs operating on high impedance load lines and simple series-parallel combining eliminates the need for both expensive low inductance device packaging and expensive hybrid combiners. The embodiment of the invention illustrated by the drawing has delivered 2 kilowatts of power into a load at a frequency of 65 MHz. and a bandwidth of 20 MHz. The output frequency of 65 MHz illustrates the application of the present invention to a much broader range of frequencies than achieved by Ikeda using the TO-3 devices.

While the principles of the present invention have been described in connection with an RF amplifier circuit using two sets of pluralities of high voltage, power switching, MOSFET devices connected so that the two sets are driven in phase opposition, these principles can be applied equally to other configurations including a basic RF amplifier circuit using just one high voltage, power switching MOSFET; an RF amplifier circuit comprising a parallel combination of such MOSFETs operable in a single ended mode, and an RF amplifier circuit made in accordance with the present invention and modified to include an inductively coupled input means for maintaining DC isolation among the gate(s) of the MOSFET(s).

Figure 9:
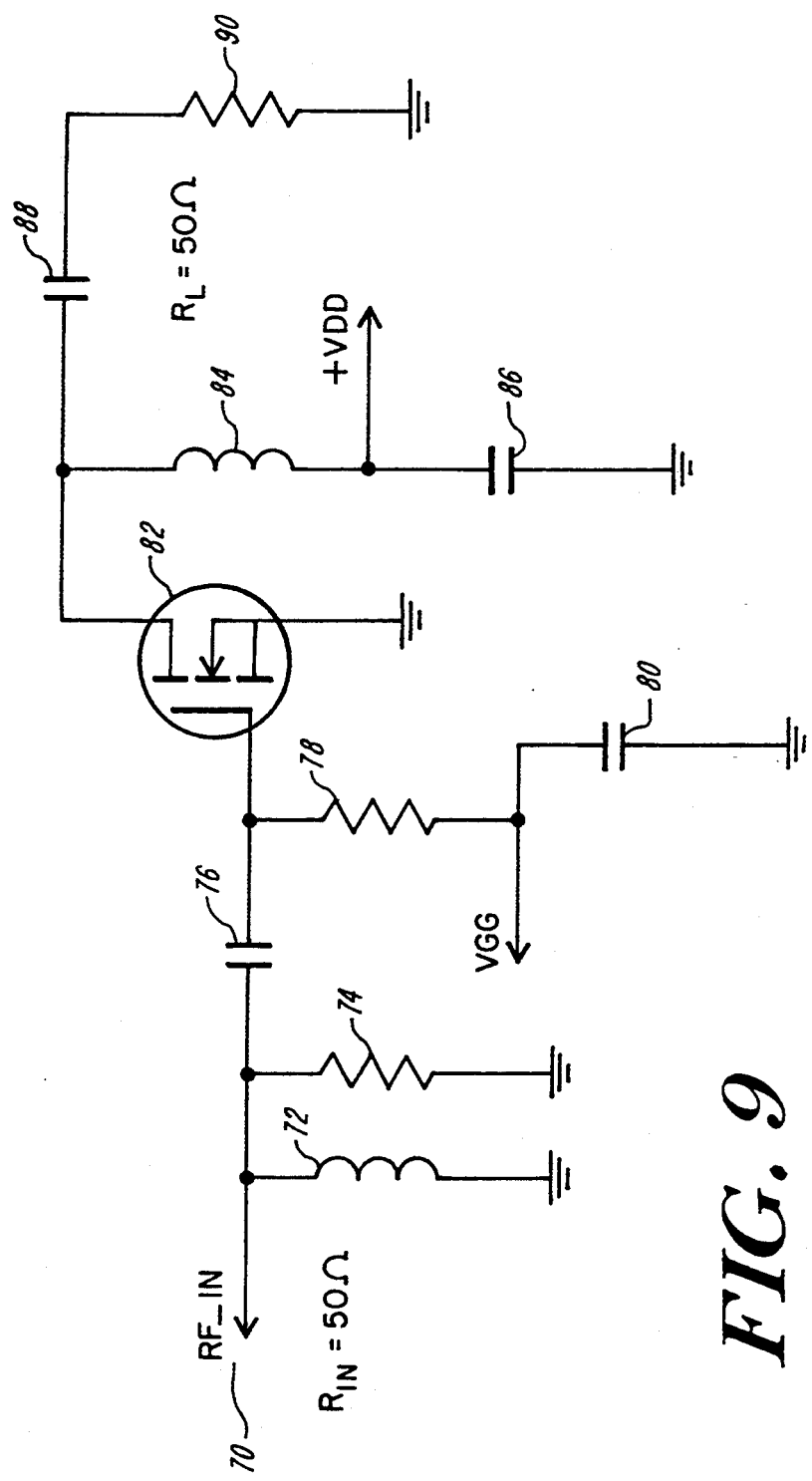
FIG. 9 shows a schematic diagram of the preferred embodiment of the present invention of the basic RF amplifier circuit using one high voltage, power switching, MOSFET device.

More specifically, in FIG. 9, the high voltage, power switching MOSFET 82 is used to provide a basic RF amplifier circuit. The circuit input 72 is connected to system ground through input inductor 72 and through resistor 74, the latter two in parallel with one another, and through capacitor 76 to the gate electrode of MOSFET 82. The gate electrode is connected to a bias source $V_{GG}$ through resistor 78. Source $V_{GG}$ is connected to capacitor 80, which in turn is connected to system ground. The source electrode of MOSFET 82 is connected to system ground, while the drain electrode is connected through inductor 84 to the bias source $+V_{DD}$, the latter being connected through capacitor 86 to system ground. The drain electrode of MOSFET 82 is also connected through capacitor 88 to the impedance load 90.

In this embodiment the high voltage, power switching MOSFET 82 is provided with a grounded source. Inductor 84 and capacitor 86 tunes the output capacitance of the device and inductor 72 tunes the effective input capacitance of the MOSFET device 82 and the input coupling capacitor 76 at the desired frequency. Resistor 78 and capacitor 80 provide sufficient RF decoupling for the DC bias $V_{GG}$ for the MOSFET 82 and the parallel combination of resistor 78 and resistor 74 preferably provides a 50 ohm input resistance at the desired frequency. Capacitor 88 provides DC blocking and also RF coupling to the load. As shown in the schematic, the load line for the device is preferably 50 ohms if the output is terminated by 50 ohms. The output from many of such amplifiers can be combined using known power combining techniques to generate multi-kilowatt RF power at any given usable frequency.

Figure 10:
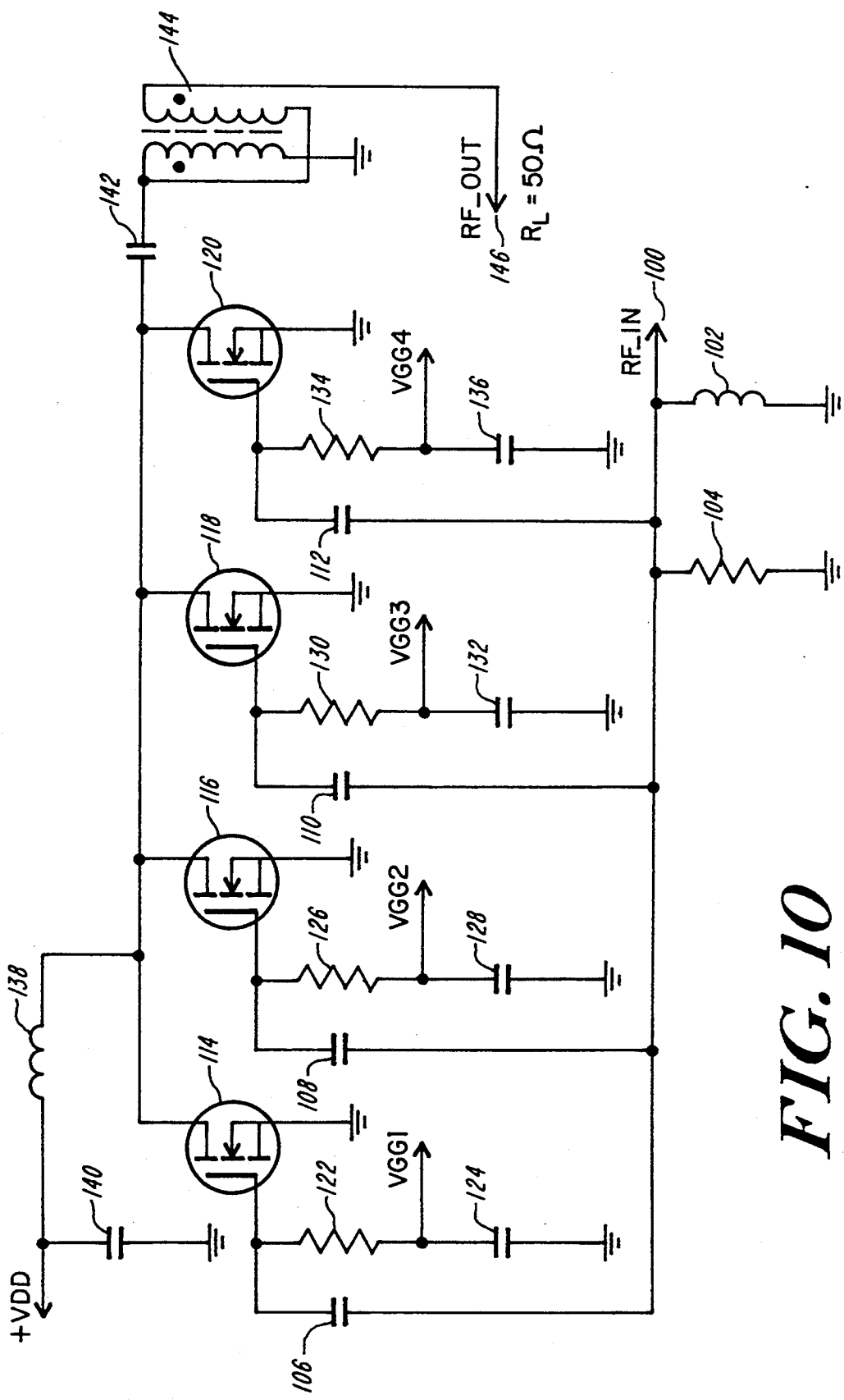
FIG. 10 shows the basic RF amplifier circuit using a parallel combination of high voltage, power switching, MOSFET devices connected to provide single ended operation.

FIG. 10 shown an RF amplifier constructed in accordance with the principles of the present invention and using a plurality of high voltage, power switching MOSFETs in a single ended configuration. In this embodiment, the input 100 is connected to system ground through input inductor 102 and through input resistor 104. The input 100 is also connected through each of the capacitors 106, 108, 110 and 112 to the gate electrodes of MOSFETs 114, 116, 118 and 120. The gate electrodes of MOSFETs 114, 116, 118 and 120 are respectively connected through resistors 122, 126, 130 and 134 to bias sources $+V_{GG1}$, $+V_{GG2}+V_{GG3}$ and $+V_{GG4}$, which in turn are connected to system ground through the corresponding capacitors 124, 128, 132 and 136. The source electrodes of the MOSFETs are all connected to system ground, while the drain electrodes are connected through inductor 138 to bias $+V_{DD}$, which in turn is connected through capacitor 140 to system ground. The drain electrodes of MOSFETs 114, 116, 118 and 120 are also connected through capacitor 142 to one coil of the balun transformer 144, the secondary coil of which provides the output signal to the output 146.

As shown in this configuration the drain electrodes of the MOSFETs are connected together. Capacitors 106, 108, 110 and 112 couple the gates of the four MOSFETs for RF, maintaining the DC isolation for biasing the MOSFETs individually. The combined resistor 122 and capacitor 124, resistor 126 and capacitor 128, resistor 130 and capacitor 132 and resistor 134 and capacitor 136 provide sufficient RF decoupling for the bias circuit for each MOSFET. Inductor 102 tunes the net input capacitance of all the MOSFET devices and resistor 104 provides the necessary damping. Inductor 138 and capacitor 140 combine to tune out the net output capacitance of the MOSFETs at the desired frequency. Balun transformer 144 is preferably a 1:4 impedance transformer, the ratio being equal to the number of MOSFETs used. If the output of this amplifier is terminated by 50 ohms, the load resistance reflected at the drains of the MOSFETs will be 12.5 ohms. Hence, the effective load line for each MOSFET will be 50 ohms. By combining the RF output from this parallel combination of MOSFETs using conventional combining techniques, multikilowatt RF power output can be generated.

Figure 11:
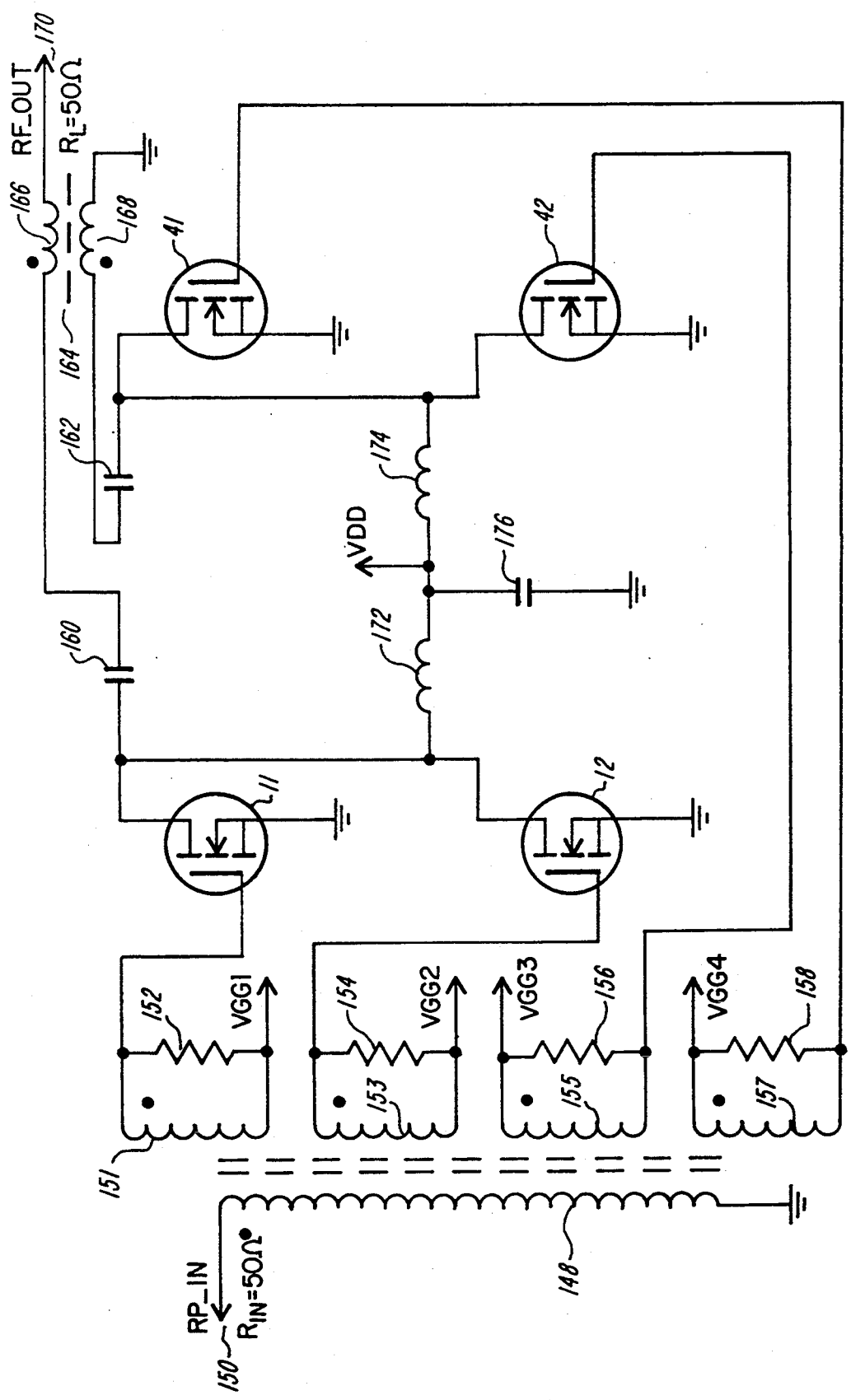
FIG. 11 shows the embodiment of the RF amplifier circuit of FIG. 8 modified so as to include inductively coupled, input coupling means so as to provide DC isolation among the gates of the MOSFET devices.

Finally, FIG. 11 shows a modification to the circuit shown in FIG. 8 so as to maintain DC isolation among the gate electrodes of the MOSFETs. In this embodiment, the input 150 is connected to the primary coil of the input transformer 148. The gate electrodes of MOSFETs 11, 12, 41 and 42 are respectively connected through secondary coils 151, 153, 157 and 155 of transformer 148 and through resistors 152, 154, 158 and 156, to the corresponding bias sources $+V_{GG1}+V_{GG2}+V_{GG3}$ and $+V_{GG4}$. The source electrodes of the MOSFETs are all connected to system ground, while the drain electrodes of MOSFETs 11 and 12 are connected together and to capacitor 160 and choke 172, while the drain electrodes of MOSFETs 41 and 42 are connected together and to capacitor 162 and choke 174. The chokes 172 and 174 are connected together and to the bias source $+V_{DD}$, the latter be coupled to system ground through capacitor 176. The capacitors 160 and 162 are connected to one end of the coils 166 and 168 of the output balun transformer 164 which provides an output at output 170 between the end of coil 166 and the end of coil 168 at system ground.

The modifications as shown in FIG. 11 provide a system for coupling the gates of high voltage, power switching MOSFET devices using a transformer, the drains of the MOSFET devices being connected in parallel and also in opposite phase. The output circuit is identical to the output circuit illustrated in FIG. 8, but modified accordingly. An input transformer 148 is preferably used for coupling the RF signal into the corresponding gates of the MOSFET devices so as to maintain DC isolation among the gates. It must be noted that the polarity of the RF signal for MOSFETs 11 and 12 are the same and polarity of MOSFETs 40 and 41 are the same, as was the case in FIG. 8. However, the polarity of the RF signal applied to the pair of MOSFETs 11 and 12 is opposite to that of the polarity of the RF signal applied to the pair of MOSFETs 41 and 42 so that the RF output from the drains of the corresponding pairs can be combined by means of an output balun transformer 164. Resistors 152, 154, 156 and 158 are used to reduce the Q-factor of the input tuned circuit. The leakage inductance of the input transformer 148 can be adjusted to tune out the input capacitance of each MOSFET device at the desired frequency. By properly choosing the values for resistors 152, 154, 156 and 158, the input resistance at the desired frequency within the required bandwidth preferably can be made to be approximately 50 ohms. In this circuit, the output is terminated by 50 ohms so that the load line for each pair of MOSFET devices is preferably 25 ohms due to the absence of coupling between the output tuning chokes 172 and 174.

It will also be obvious that the teachings of this invention can be used to combine the outputs of more devices to produce higher output power. For example, although the number of MOSFETs used in the FIG. 10 embodiment is shown as four, the number of MOSFETs used can vary (the minimum of one being shown in FIG. 9). In addition, MOSFET devices 11 and 12 and 41 and 42 of FIGS. 8 and 11 may be paralleled by additional devices. The penalty for this increase in power, of course, is a reduction in circuit impedance with each additional device, but not in individual device load line. Input and output impedance matching devices will therefore have to be used. Since the use of high voltage power switching MOSFETs provides a 16:1 impedance advantage and a 4:1 current advantage, however, the cost of matching devices will be less than those needed for conventional RF MOSFET designs. Several devices are described in the article, "Practical Wideband RF Power Transformers, Combiners, and Splitters", by Roderick K. Blocksome, RF Expo Feast Proceedings, November, 1986. Another alternative is to combine complete amplifier circuits. If two are connected in parallel, the input and output impedances will be halved. Four amplifier circuits can be connected in a series-parallel arrangement similar to the connection of individual devices in each amplifier circuit to eliminate impedance transformation.

We have thus described a novel arrangement for producing high power at RF frequencies from a low cost, reliable solid state circuit. The improved RF power amplifier (1) uses non-RF packaged, high voltage, power switching MOSFETs of the TO-220 or TO-247 type having coplanar leads for ease of connection and lead inductances between about 8 nH and 15 nH, (2) does not require expensive low inductance packaging, (3) can be connected to relatively large impedance loads without the need for expensive combiners and (4) is capable of efficiently operating at frequencies between 100 KHz and 100 MHz and higher. For example, using one or more of the high voltage, power switching MOSFETs of the type described in FIGS. 6 and 7 in an RF amplifier design in accordance with the present invention allows for an lead inductance of the entire package on the order of 8 nH and 15 nH, as compared to the relatively low output inductance of 1 nH to 4 nH provided with low inductance RF packaging of the prior art.

Since certain changes may be made in the above apparatus without departing from the scope of the invention herein involved, it is intended that all matter contained in the above description or shown in the accompanying drawing shall be interpreted in an illustrative and not in a limiting sense.

What is claimed is:

1. A high power, radio frequency, linear amplifier for amplifying a radio frequency, input signal in the range between about 100 kHz and 100 MHz so as to produce a high power output signal replica of said input signal, said amplifier comprising:
   at least one non-RF high voltage, power switching, MOSFET device having a gate, source and drain electrode extending in a coplanar relation and having a lead inductance on the order of between about 8 nH and about 15 nH;
   driving means for connecting said input signal between the gate and source electrodes of said device; and
   coupling and matching means, connected to the drain electrode of said device, for providing said output signal replica of solid input signal.

2. A high power, radio frequency, linear amplifier according to claim 1, further including means for maintaining DC isolation on said gate electrode.

3. A high power, radio frequency, linear amplifier according to claim 1, wherein said input signal is at a center frequency on the order of 65 MHz with a bandwidth of about 20 MHz.

4. A high power, radio frequency, linear amplifier for amplifying a radio frequency, input signal so as to produce a high power output signal replica of said input signal at a frequency between about 100 kHz and 100 MHz, said amplifier comprising:
   a first plurality of non-RF high voltage, power switching, MOSFET devices connected directly in parallel, each of said devices having a gate, source and drain electrode coplanar with one another and having lead inductances of between about 8 nH and 15 nH;
   driving means for connecting said input signal between the gates and sources of said plurality of devices; and
   coupling and matching means, connected to the drain electrodes of said plurality of devices, for providing said output signal replica of said input signal.

5. A high power, radio frequency, linear amplifier according to claim 4, further including means for maintaining DC isolation on among the gates of said MOSFET devices.

6. A high power, radio frequency, linear amplifier as in claim 4, further including
   a second plurality of non-RF high voltage, power switching, MOSFET devices connected in parallel;
   wherein said driving means connects said input signal between the gates and sources of said first plurality of devices, and connects the inverse of said input signal between the gates and sources of said second plurality so as to drive said first and second pluralities in phase opposition; and said coupling and matching means is connected to the drain electrodes of said first and second pluralities so as to combine signals from said drain electrodes so as to produce said output signal replica.

7. A high power radio frequency, linear amplifier as in claim 6, wherein
   said first and second pluralities each comprise two high voltage power switching MOSFETs.

8. A high power radio frequency, linear amplifier as in claim 6, wherein
   within each of said pluralities of devices, the respective source electrodes are connected together conductively, the respective drain electrodes are connected together conductively, and the gate electrodes are connected together capacitively.

9. A high power radio frequency, linear amplifier as in claim 6, wherein
   the gate electrode of each of said high voltage power switching MOSFET devices is connected to a respective independent bias voltage source.

10. A high power radio frequency, linear amplifier as in claim 6, wherein
    each of said MOSFET devices operates on a load line impedance of at least 15 ohms.

11. A high power radio frequency, linear amplifier as in claim 6, wherein said coupling and matching means comprises a simple balun transformer having two windings.

12. A high power radio frequency, linear amplifier as in claim 11, wherein
    the effective turns ratio of said balun transformer is 1:1.

13. A high power radio frequency, linear amplifier as in claim 11, further comprising an output terminal for delivery of said output signal, and wherein
    one end of one of said windings of said coupling and matching means is connected to system ground;
    the other end of said one winding is connected at RF frequencies to the drain electrodes of said first plurality of MOSFET devices;
    one end of the other of said windings of said coupling and matching means is connected to said output terminal; and
    the other end of said other winding is connected at RF frequencies to the drain electrodes of said second plurality of MOSFET devices.

14. A high power radio frequency, linear amplifier as in claim 6, wherein
    said driving means comprises a simple balun transformer having two windings.

15. A high power radio frequency, linear amplifier as in claim 14, wherein the effective turns ratio of said balun transformer is 1:1.

16. A high power radio frequency linear amplifier as in claim 14, further comprising an input terminal for reception of said input signal, and wherein
    one end of one of said windings of said driving means is connected to system ground;
    the other end of said one winding is connected at RF frequencies to the gate electrodes of said second plurality of MOSFET devices;

one end of the other of said windings of said driving means is connected at RF frequencies to said input terminal; and the other end of said other winding is connected to the gate electrodes of said first plurality of MOSFET devices.

17. A high power, radio frequency, linear amplifier according to claim 4 wherein said input signal is at a center frequency on the order of 65 MHz with a bandwidth of about 20 MHz.

* * * * *